United States Patent
Champlin

(10) Patent No.: US 9,851,411 B2
(45) Date of Patent: Dec. 26, 2017

(54) SUPPRESSING HF CABLE OSCILLATIONS DURING DYNAMIC MEASUREMENTS OF CELLS AND BATTERIES

(71) Applicant: Keith S. Champlin, Minneapolis, MN (US)

(72) Inventor: Keith S. Champlin, Minneapolis, MN (US)

(*) Notice: Subject to any disclaimer, the term of this patent is extended or adjusted under 35 U.S.C. 154(b) by 423 days.

(21) Appl. No.: 13/795,840

(22) Filed: Mar. 12, 2013

(65) Prior Publication Data

US 2014/0002094 A1  Jan. 2, 2014

Related U.S. Application Data

(60) Provisional application No. 61/665,456, filed on Jun. 28, 2012.

(51) Int. Cl.
G01R 31/36 (2006.01)
G01R 1/06 (2006.01)
G01R 27/14 (2006.01)

(52) U.S. Cl.
CPC ..... G01R 31/3624 (2013.01); G01R 31/3662 (2013.01); G01R 1/06 (2013.01); G01R 27/14 (2013.01); G01R 31/3627 (2013.01)

(58) Field of Classification Search
CPC .......................... G01R 31/3624; G01N 27/416
(Continued)

(56) References Cited

U.S. PATENT DOCUMENTS

| 85,553 A | 1/1869 | Adams ............................ 33/472 |
| 2,000,665 A | 5/1935 | Neal .............................. 439/440 |

(Continued)

FOREIGN PATENT DOCUMENTS

| CN | 2470964 Y | 1/2002 |
| CN | 201063352 Y | 5/2008 |

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner* — Nathaniel Pelton
*Assistant Examiner* — Dung V Bui
(74) *Attorney, Agent, or Firm* — Westman, Champlin & Koehler, P.A.

(57) ABSTRACT

Kelvin (4-wire) connecting cables are routinely used when performing dynamic measurements (i.e., measurements with time-varying signals) on electrochemical cells and batteries. Current-carrying and voltage-sensing conductor pairs within such cables comprise distributed-parameter two-wire transmission lines which may extend several meters in length. As with all such transmission lines, internally reflected waves can oscillate back and forth at high frequency (hf) whenever the lines are not terminated in their characteristic impedances. Such hf reflected waves, by interacting with measuring circuitry, can seriously degrade low-frequency measurement accuracy. Apparatus is disclosed herein that suppresses hf reflected waves oscillating on Kelvin connecting cables during dynamic measurements of cells and batteries.

15 Claims, 3 Drawing Sheets

(58) Field of Classification Search
USPC .................................................. 324/426
See application file for complete search history.

(56) References Cited

U.S. PATENT DOCUMENTS

| | | | |
|---|---|---|---|
| 2,254,846 A | 9/1941 | Heyer | 324/437 |
| 2,417,940 A | 3/1947 | Lehman | 200/61.25 |
| 2,437,772 A | 3/1948 | Wall | 324/523 |
| 2,514,745 A | 7/1950 | Dalzell | 324/115 |
| 2,727,221 A | 12/1955 | Springg | 340/447 |
| 3,178,686 A | 2/1960 | Mills | 340/447 |
| 3,025,455 A | 3/1962 | Jonsson | 323/369 |
| 3,267,452 A | 12/1963 | Wolf | 340/249 |
| 3,215,194 A | 11/1965 | Sununu et al. | 165/80.3 |
| 3,223,969 A | 12/1965 | Alexander | 340/447 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,699,433 A | 10/1972 | Smith, Jr. | 324/523 |
| 3,729,989 A | 5/1973 | Little | 73/862.192 |
| 3,745,441 A | 7/1973 | Soffer | 290/14 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,879,654 A | 4/1975 | Kessinger | 324/434 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A | 2/1976 | Perlmutter | 324/772 |
| 3,939,400 A | 2/1976 | Steele | 324/434 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,176,315 A | 11/1979 | Sunnarborg | 324/133 |
| 4,178,546 A | 12/1979 | Hulls et al. | 324/772 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,218,745 A | 8/1980 | Perkins | 324/66 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 6/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,425,791 A | 1/1984 | Kling | 73/116.02 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,626,765 A | 12/1986 | Tanaka | 320/127 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koench | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |

(56) References Cited

U.S. PATENT DOCUMENTS

| | | | |
|---|---|---|---|
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,083,076 A | 1/1992 | Scott | 320/105 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |
| 5,160,881 A | 11/1992 | Schramm et al. | 322/7 |
| 5,164,653 A | 11/1992 | Reem | |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,381 A | 2/1993 | Kondo | 307/10.1 |
| 5,187,382 A | 2/1993 | Kondo | |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,223,747 A | 6/1993 | Tschulena | 257/713 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,296,823 A * | 3/1994 | Dietrich | H01P 5/10 333/161 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,309,052 A * | 5/1994 | Kim | H02K 11/02 174/350 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,345,384 A | 9/1994 | Przybyla et al. | 701/29.1 |
| 5,347,163 A | 9/1994 | Yoshimura | 307/66 |
| 5,349,535 A | 9/1994 | Gupta | 320/106 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,384,540 A | 1/1995 | Dessel | 324/539 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 29/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,462,439 A | 10/1995 | Keith | 180/279 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,631,831 A | 5/1997 | Bird et al. | 701/34.4 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | 320/134 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,685,734 A | 11/1997 | Kutz | 439/371 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |

(56) References Cited

U.S. PATENT DOCUMENTS

| | | | |
|---|---|---|---|
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 320/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | Van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A | 2/1999 | Takahashi | 320/104 |
| 5,870,018 A | 2/1999 | Person | 307/10.2 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,884,202 A | 3/1999 | Arjomand | 701/31.4 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,916,287 A | 6/1999 | Arjomand et al. | 701/33.2 |
| 5,927,938 A | 7/1999 | Hammerslag | 414/809 |
| 5,929,609 A | 7/1999 | Joy et al. | 322/25 |
| 5,935,180 A | 8/1999 | Fieramosca et al. | 701/29.6 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,953,322 A | 9/1999 | Kimball | 370/328 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,963,012 A | 10/1999 | Garcia et al. | 320/106 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,081,154 A | 6/2000 | Ezell et al. | 327/540 |
| 6,087,815 A | 7/2000 | Pfeifer et al. | 323/282 |
| 6,088,652 A | 7/2000 | Abe | 324/434 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,121,880 A | 9/2000 | Scott et al. | 340/572.5 |
| 6,136,914 A | 10/2000 | Hergenrother et al. | 524/495 |
| 6,137,269 A | 10/2000 | Champlin | 320/150 |
| 6,140,797 A | 10/2000 | Dunn | 320/105 |
| 6,141,608 A | 10/2000 | Rother | 701/29.6 |
| 6,144,185 A | 11/2000 | Dougherty et al. | 320/132 |
| 6,147,598 A | 11/2000 | Murphy et al. | 340/426.19 |
| 6,149,653 A | 11/2000 | Deslauriers | 606/232 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,184,656 B1 | 2/2001 | Karunasiri et al. | 320/119 |
| 6,191,557 B1 | 2/2001 | Gray et al. | 320/132 |
| 6,202,739 B1 | 3/2001 | Pal et al. | 165/104.33 |
| 6,211,651 B1 | 4/2001 | Nemoto | 320/133 |
| 6,211,653 B1 | 4/2001 | Stasko | 320/132 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,225,898 B1 | 5/2001 | Kamiya et al. | 340/505 |
| 6,236,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,242,921 B1 | 6/2001 | Thibedeau et al. | 324/429 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,255,826 B1* | 7/2001 | Ohsawa | B60K 6/28 320/116 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,262,692 B1 | 7/2001 | Babb | 343/895 |
| 6,263,268 B1 | 7/2001 | Nathanson | 701/29 |
| 6,263,322 B1 | 7/2001 | Kirkevold et al. | 705/400 |
| 6,271,643 B1 | 8/2001 | Becker et al. | 320/112 |
| 6,271,748 B1 | 8/2001 | Derbyshire et al. | 340/442 |
| 6,272,387 B1 | 8/2001 | Yoon | 700/83 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |

(56) References Cited

U.S. PATENT DOCUMENTS

| | | | |
|---|---|---|---|
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,320,385 B1 | 11/2001 | Ng et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,389,337 B1 | 5/2002 | Kolls | 701/31.6 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 * | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,433,512 B1 | 8/2002 | Birkler et al. | 320/132 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,470,385 B1 | 10/2002 | Nakashima et al. | 324/378 |
| 6,473,659 B1 | 10/2002 | Shah et al. | 700/79 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,501,243 B1 | 12/2002 | Kaneko | 318/139 |
| 6,505,507 B1 | 1/2003 | Imao | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,533,316 B2 | 3/2003 | Breed et al. | 280/735 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,636,790 B1 | 10/2003 | Lightner et al. | 701/31.5 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,732,031 B1 | 5/2004 | Lightner et al. | 701/31.4 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness | 324/426 |
| 6,771,073 B2 | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,832,141 B2 | 12/2004 | Skeen et al. | 701/31.4 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,162 B1 | 2/2005 | Greatorex et al. | 324/764.01 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,895,809 B2 | 5/2005 | Raichle | 73/119 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,911,825 B2 | 6/2005 | Namaky | 324/426 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,957,133 B1 | 10/2005 | Hunt et al. | 701/32.4 |
| 6,967,484 B2 | 11/2005 | Bertness | 324/426 |
| 6,972,662 B1 | 12/2005 | Ohkawa et al. | 340/10.1 |
| 6,983,212 B2 | 1/2006 | Burns | 702/63 |
| 6,988,053 B2 | 1/2006 | Namaky | 320/104 |
| 6,993,421 B2 | 1/2006 | Pillar et al. | 701/29.4 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,042,346 B2 | 5/2006 | Paulsen | 340/438 |
| 7,049,822 B2 | 5/2006 | Kung | 324/426 |
| 7,058,525 B2 | 6/2006 | Bertness et al. | 702/63 |
| 7,069,979 B2 | 7/2006 | Tobias | 165/104.33 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |

(56) References Cited

U.S. PATENT DOCUMENTS

| | | | |
|---|---|---|---|
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,170,393 B2 | 1/2007 | Martin | 340/10.1 |
| 7,173,182 B2 * | 2/2007 | Katsuyama | H01R 9/031 174/36 |
| 7,177,925 B2 | 2/2007 | Carcido et al. | 709/223 |
| 7,182,147 B2 | 2/2007 | Cutler et al. | 173/1 |
| 7,184,866 B2 | 2/2007 | Squires | 340/426.15 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2 | 4/2007 | Reynolds et al. | 320/166 |
| 7,208,914 B2 | 4/2007 | Klang | 320/132 |
| 7,209,850 B2 * | 4/2007 | Brott et al. | 702/117 |
| 7,209,860 B2 | 4/2007 | Trsar et al. | 702/183 |
| 7,212,887 B2 | 5/2007 | Shah et al. | 700/276 |
| 7,212,911 B2 | 5/2007 | Raichle et al. | 701/114 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,251,551 B2 | 7/2007 | Mitsueda | 700/2 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,376,497 B2 | 5/2008 | Chen | 701/31.6 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,505,856 B2 * | 3/2009 | Restaino et al. | 702/63 |
| 7,538,571 B2 | 5/2009 | Raichle et al. | 324/772 |
| 7,545,146 B2 | 6/2009 | Klang et al. | 324/426 |
| 7,557,586 B1 | 7/2009 | Vonderhaar et al. | 324/437 |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,667,437 B2 | 2/2010 | Johnson et al. | 320/150 |
| 7,679,325 B2 | 3/2010 | Seo | 320/116 |
| 7,684,908 B1 | 3/2010 | Ogilvie et al. | 701/29.6 |
| 7,688,074 B2 | 3/2010 | Cox et al. | 324/426 |
| 7,690,573 B2 | 4/2010 | Raichle et al. | 235/462 |
| 7,696,759 B2 | 4/2010 | Raichle et al. | 324/538 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,710,119 B2 | 5/2010 | Bertness | 324/426 |
| 7,723,993 B2 | 5/2010 | Klang | 324/431 |
| 7,728,556 B2 | 6/2010 | Yano et al. | 320/134 |
| 7,728,597 B2 | 6/2010 | Bertness | 324/426 |
| 7,743,788 B2 | 6/2010 | Schmitt | 137/554 |
| 7,744,149 B2 | 6/2010 | Murray et al. | 307/31 |
| 7,751,953 B2 | 7/2010 | Namaky | 701/33.2 |
| 7,772,850 B2 | 8/2010 | Bertness | 324/426 |
| 7,774,130 B2 | 8/2010 | Pepper | 340/439 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,848,857 B2 | 12/2010 | Nasr et al. | 701/22 |
| 7,883,002 B2 | 2/2011 | Jin et al. | 235/376 |
| 7,902,990 B2 | 3/2011 | Delmonico et al. | 340/636.1 |
| 7,924,015 B2 | 4/2011 | Bertness | 324/427 |
| 7,940,053 B2 | 5/2011 | Brown et al. | 324/426 |
| 7,990,155 B2 * | 8/2011 | Henningson | 324/429 |
| 7,999,505 B2 | 8/2011 | Bertness | 320/104 |
| 8,024,083 B2 | 9/2011 | Chenn | 701/2 |
| 8,164,343 B2 | 4/2012 | Bertness | 324/503 |
| 8,222,868 B2 | 7/2012 | Buckner | 320/136 |
| 8,226,008 B2 | 7/2012 | Raichle et al. | 235/462.13 |
| 8,306,690 B2 | 11/2012 | Bertness | 701/34.4 |
| 8,310,271 B2 | 11/2012 | Raichle et al. | 324/765.01 |
| 8,449,560 B2 | 5/2013 | Roth | 227/175.1 |
| 8,594,957 B2 | 11/2013 | Gauthier | 324/548 |
| 8,827,729 B2 | 9/2014 | Gunreben | 439/188 |
| 9,037,394 B2 | 5/2015 | Fernandes | 701/400 |
| 2001/0012738 A1 | 8/2001 | Duperret | 439/835 |
| 2001/0033169 A1 | 10/2001 | Singh | 324/426 |
| 2001/0035737 A1 | 11/2001 | Nakanishi et al. | 320/122 |
| 2001/0048215 A1 | 12/2001 | Breed et al. | 280/728.1 |
| 2001/0048226 A1 | 12/2001 | Nada | 290/40 |
| 2002/0003423 A1 | 1/2002 | Bertness et al. | 324/426 |
| 2002/0004694 A1 | 1/2002 | McLeod | 701/29 |
| 2002/0007237 A1 | 1/2002 | Phung et al. | 701/33 |
| 2002/0010558 A1 | 1/2002 | Bertness et al. | 702/63 |
| 2002/0021135 A1 | 2/2002 | Li et al. | 324/677 |
| 2002/0027346 A1 | 3/2002 | Breed et al. | 280/735 |
| 2002/0030495 A1 | 3/2002 | Kechmire | 324/427 |
| 2002/0036504 A1 * | 3/2002 | Troy et al. | 324/430 |
| 2002/0041175 A1 | 4/2002 | Lauper et al. | 320/106 |
| 2002/0044050 A1 | 4/2002 | Derbyshire et al. | 340/442 |
| 2002/0047711 A1 | 4/2002 | Bertness et al. | 324/426 |
| 2002/0050163 A1 | 5/2002 | Makhija et al. | 73/116 |
| 2002/0074398 A1 | 6/2002 | Lancos et al. | 235/382 |
| 2002/0116140 A1 | 8/2002 | Rider | 702/63 |
| 2002/0118111 A1 | 8/2002 | Brown et al. | 340/573.1 |
| 2002/0121901 A1 | 9/2002 | Hoffman | 324/426 |
| 2002/0128985 A1 | 9/2002 | Greenwald | 705/400 |
| 2002/0130665 A1 | 9/2002 | Bertness et al. | 324/426 |
| 2002/0171428 A1 | 11/2002 | Bertness | 702/63 |
| 2002/0176010 A1 | 11/2002 | Wallach et al. | 348/362 |
| 2003/0006779 A1 | 1/2003 | Youval | 324/503 |
| 2003/0009270 A1 | 1/2003 | Breed | 701/29 |
| 2003/0017753 A1 | 1/2003 | Palmisano et al. | 439/762 |
| 2003/0025481 A1 | 2/2003 | Bertness | 324/427 |
| 2003/0030442 A1 | 2/2003 | Sugimoto | 324/429 |
| 2003/0036909 A1 | 2/2003 | Kato | 704/275 |
| 2003/0040873 A1 | 2/2003 | Lesesky et al. | 702/57 |
| 2003/0060953 A1 | 3/2003 | Chen | 701/33 |
| 2003/0078743 A1 | 4/2003 | Bertness et al. | 702/63 |
| 2003/0088375 A1 | 5/2003 | Bertness et al. | 702/63 |
| 2003/0090272 A1 | 5/2003 | Bertness | 324/426 |
| 2003/0124417 A1 | 7/2003 | Bertness et al. | 429/90 |
| 2003/0128011 A1 | 7/2003 | Bertness et al. | |
| 2003/0128036 A1 | 7/2003 | Henningson et al. | 324/426 |
| 2003/0137277 A1 | 7/2003 | Mori et al. | 320/132 |
| 2003/0169018 A1 | 9/2003 | Berels et al. | 320/132 |
| 2003/0169019 A1 | 9/2003 | Oosaki | 320/132 |
| 2003/0171111 A1 | 9/2003 | Clark | 455/414.1 |
| 2003/0177417 A1 | 9/2003 | Malhotra et al. | 714/42 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2003/0236656 A1 | 12/2003 | Dougherty | 703/14 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |

(56) References Cited

U.S. PATENT DOCUMENTS

| | | |
|---|---|---|
| 2004/0032264 A1 | 2/2004 | Schoch .................... 324/426 |
| 2004/0036443 A1 | 2/2004 | Bertness .................... 320/109 |
| 2004/0044452 A1 | 3/2004 | Bauer et al. .................... 703/33 |
| 2004/0044454 A1 | 3/2004 | Ross et al. .................... 701/33 |
| 2004/0049361 A1 | 3/2004 | Hamdan et al. .................... 702/115 |
| 2004/0051532 A1 | 3/2004 | Smith et al. .................... 324/426 |
| 2004/0051533 A1 | 3/2004 | Namaky .................... 324/426 |
| 2004/0051534 A1 | 3/2004 | Kobayashi et al. .................... 324/429 |
| 2004/0054503 A1 | 3/2004 | Namaky .................... 702/182 |
| 2004/0064225 A1 | 4/2004 | Jammu et al. .................... 701/29 |
| 2004/0065489 A1 | 4/2004 | Aberle .................... 180/65.1 |
| 2004/0088087 A1 | 5/2004 | Fukushima et al. .................... 701/32 |
| 2004/0104728 A1 | 6/2004 | Bertness et al. .................... 324/429 |
| 2004/0108855 A1 | 6/2004 | Raichle .................... 324/378 |
| 2004/0113588 A1 | 6/2004 | Mikuriya et al. .................... 320/128 |
| 2004/0145342 A1 | 7/2004 | Lyon .................... 320/108 |
| 2004/0150494 A1* | 8/2004 | Yoshida .................... H01P 1/202 333/243 |
| 2004/0164706 A1 | 8/2004 | Osborne .................... 320/116 |
| 2004/0172177 A1 | 9/2004 | Nagai et al. .................... 701/29 |
| 2004/0178185 A1 | 9/2004 | Yoshikawa et al. .................... 219/270 |
| 2004/0189309 A1 | 9/2004 | Bertness et al. .................... 324/426 |
| 2004/0199343 A1 | 10/2004 | Cardinal et al. .................... 702/63 |
| 2004/0207367 A1 | 10/2004 | Taniguchi et al. .................... 320/149 |
| 2004/0221641 A1 | 11/2004 | Moritsugu .................... 73/23.31 |
| 2004/0227523 A1 | 11/2004 | Namaky .................... 324/537 |
| 2004/0239332 A1 | 12/2004 | Mackel et al. .................... 324/426 |
| 2004/0251876 A1 | 12/2004 | Bertness et al. .................... 320/136 |
| 2004/0257084 A1 | 12/2004 | Restaino .................... 324/400 |
| 2005/0007068 A1 | 1/2005 | Johnson et al. .................... 320/110 |
| 2005/0009122 A1 | 1/2005 | Whelan et al. .................... 435/7.32 |
| 2005/0017726 A1 | 1/2005 | Koran et al. .................... 324/433 |
| 2005/0017952 A1 | 1/2005 | His .................... 345/169 |
| 2005/0021197 A1 | 1/2005 | Zimmerman .................... 701/31.4 |
| 2005/0021294 A1 | 1/2005 | Trsar et al. .................... 702/183 |
| 2005/0025299 A1 | 2/2005 | Tischer et al. .................... 379/44.31 |
| 2005/0043868 A1 | 2/2005 | Mitcham .................... 701/29 |
| 2005/0057256 A1 | 3/2005 | Bertness .................... 324/426 |
| 2005/0060070 A1 | 3/2005 | Kapolka et al. .................... 701/29 |
| 2005/0073314 A1 | 4/2005 | Bertness et al. .................... 324/433 |
| 2005/0076381 A1 | 4/2005 | Gross .................... 725/107 |
| 2005/0096809 A1 | 5/2005 | Skeen et al. .................... 701/29 |
| 2005/0102073 A1 | 5/2005 | Ingram .................... 701/29 |
| 2005/0119809 A1 | 6/2005 | Chen .................... 701/33.5 |
| 2005/0128083 A1 | 6/2005 | Puzio et al. .................... 340/572.1 |
| 2005/0128902 A1 | 6/2005 | Tsai .................... 369/44.32 |
| 2005/0133245 A1* | 6/2005 | Katsuyama .................... H01R 9/031 174/74 R |
| 2005/0134282 A1* | 6/2005 | Averbuch .................... G01R 31/3651 324/426 |
| 2005/0143882 A1 | 6/2005 | Umezawa .................... 701/29 |
| 2005/0159847 A1 | 7/2005 | Shah et al. .................... 700/276 |
| 2005/0162172 A1 | 7/2005 | Bertness .................... 324/426 |
| 2005/0168226 A1 | 8/2005 | Quint et al. .................... 324/426 |
| 2005/0173142 A1 | 8/2005 | Cutler et al. .................... 173/181 |
| 2005/0182536 A1 | 8/2005 | Doyle et al. .................... 701/29 |
| 2005/0212521 A1 | 9/2005 | Bertness et al. .................... 324/426 |
| 2005/0213874 A1* | 9/2005 | Kline .................... 385/15 |
| 2005/0218902 A1 | 10/2005 | Restaino et al. .................... 324/433 |
| 2005/0231205 A1 | 10/2005 | Bertness et al. .................... 324/426 |
| 2005/0254106 A9 | 11/2005 | Silverbrook et al. .................... 358/539 |
| 2005/0256617 A1 | 11/2005 | Cawthorne et al. .................... 701/22 |
| 2005/0258241 A1 | 11/2005 | McNutt et al. .................... 235/385 |
| 2005/0269880 A1 | 12/2005 | Konishi .................... 307/10.7 |
| 2005/0273218 A1 | 12/2005 | Breed .................... 701/2 |
| 2006/0012330 A1 | 1/2006 | Okumura et al. .................... 320/103 |
| 2006/0017447 A1* | 1/2006 | Bertness et al. .................... 324/538 |
| 2006/0026017 A1 | 2/2006 | Walkder .................... 701/31.4 |
| 2006/0030980 A1 | 2/2006 | St. Denis .................... 701/29 |
| 2006/0043976 A1 | 3/2006 | Gervais .................... 324/508 |
| 2006/0079203 A1 | 4/2006 | Nicolini .................... 455/411 |
| 2006/0089767 A1 | 4/2006 | Sowa .................... 701/29 |
| 2006/0095230 A1 | 5/2006 | Grier et al. .................... 702/183 |
| 2006/0102397 A1 | 5/2006 | Buck .................... 429/432 |
| 2006/0152224 A1 | 7/2006 | Kim et al. .................... 324/430 |
| 2006/0155439 A1 | 7/2006 | Slawinski .................... 701/33.4 |
| 2006/0161313 A1 | 7/2006 | Rogers et al. .................... 701/1 |
| 2006/0161390 A1 | 7/2006 | Namaky et al. .................... 702/183 |
| 2006/0217914 A1 | 9/2006 | Bertness .................... 702/113 |
| 2006/0244457 A1* | 11/2006 | Henningson .................... G01R 31/006 324/426 |
| 2006/0282323 A1 | 12/2006 | Walker et al. .................... 705/14 |
| 2007/0005201 A1 | 1/2007 | Chenn .................... 701/31.5 |
| 2007/0024460 A1 | 2/2007 | Clark .................... 340/663 |
| 2007/0026916 A1 | 2/2007 | Juds et al. .................... 463/1 |
| 2007/0046261 A1 | 3/2007 | Porebski .................... 320/132 |
| 2007/0088472 A1 | 4/2007 | Ganzhorn et al. .................... 701/33 |
| 2007/0108942 A1 | 5/2007 | Johnson et al. .................... 320/112 |
| 2007/0159177 A1 | 7/2007 | Bertness et al. .................... 324/426 |
| 2007/0182576 A1 | 8/2007 | Proska et al. .................... 340/636.1 |
| 2007/0194791 A1 | 8/2007 | Huang .................... 324/430 |
| 2007/0194793 A1 | 8/2007 | Bertness .................... 324/503 |
| 2007/0205752 A1 | 9/2007 | Leigh .................... 324/500 |
| 2007/0205983 A1 | 9/2007 | Naimo .................... 345/160 |
| 2007/0210801 A1 | 9/2007 | Krampitz .................... 324/426 |
| 2007/0259256 A1 | 11/2007 | Le Canut et al. .................... 429/90 |
| 2007/0279066 A1 | 12/2007 | Chism .................... 324/437 |
| 2008/0023547 A1 | 1/2008 | Raichle .................... 235/462.13 |
| 2008/0036421 A1 | 2/2008 | Seo .................... 320/132 |
| 2008/0053716 A1 | 3/2008 | Scheucher .................... 180/2.1 |
| 2008/0059014 A1 | 3/2008 | Nasr et al. .................... 701/22 |
| 2008/0064559 A1 | 3/2008 | Cawthorne .................... 477/5 |
| 2008/0086246 A1 | 4/2008 | Bolt et al. .................... 701/29 |
| 2008/0094068 A1 | 4/2008 | Scott .................... 324/426 |
| 2008/0103656 A1 | 5/2008 | Lipscomb .................... 701/33.4 |
| 2008/0169818 A1 | 7/2008 | Lesesky et al. .................... 324/426 |
| 2008/0179122 A1 | 7/2008 | Sugawara .................... 180/65.245 |
| 2008/0303528 A1 | 12/2008 | Kim .................... 324/430 |
| 2008/0303529 A1 | 12/2008 | Nakamura et al. .................... 324/433 |
| 2008/0315830 A1 | 12/2008 | Bertness .................... 320/104 |
| 2009/0006476 A1 | 1/2009 | Andreasen et al. .................... 707/104.1 |
| 2009/0024266 A1 | 1/2009 | Bertness .................... 701/22 |
| 2009/0024419 A1 | 1/2009 | McClellan .................... 705/4 |
| 2009/0085571 A1 | 4/2009 | Bertness .................... 324/426 |
| 2009/0146800 A1 | 6/2009 | Grimlund et al. .................... 340/505 |
| 2009/0198372 A1 | 8/2009 | Hammerslag .................... 700/226 |
| 2009/0203247 A1 | 8/2009 | Fifelski .................... 439/345 |
| 2009/0237086 A1 | 9/2009 | Andelfinger .................... 324/431 |
| 2009/0247020 A1 | 10/2009 | Gathman et al. .................... 439/759 |
| 2009/0265121 A1 | 10/2009 | Rocci .................... 702/57 |
| 2009/0276115 A1 | 11/2009 | Chen .................... 701/32 |
| 2009/0311919 A1 | 12/2009 | Smith .................... 439/759 |
| 2010/0023198 A1 | 1/2010 | Hamilton .................... 701/29 |
| 2010/0066283 A1 | 3/2010 | Kitanaka .................... 318/400.02 |
| 2010/0117603 A1 | 5/2010 | Makhija .................... 320/162 |
| 2010/0145780 A1 | 6/2010 | Nishikawa et al. .................... 705/14.11 |
| 2010/0214055 A1 | 8/2010 | Fuji .................... 340/3.1 |
| 2010/0314950 A1 | 12/2010 | Rutkowski et al. .................... 307/125 |
| 2011/0004427 A1 | 1/2011 | Gorbold et al. .................... 702/63 |
| 2011/0015815 A1 | 1/2011 | Bertness .................... 701/22 |
| 2011/0215767 A1 | 9/2011 | Johnson et al. .................... 320/136 |
| 2011/0273181 A1 | 11/2011 | Park et al. .................... 324/429 |
| 2012/0041697 A1 | 2/2012 | Stukenberg .................... 702/63 |
| 2012/0046824 A1 | 2/2012 | Ruther et al. .................... 701/31.5 |
| 2012/0062237 A1 | 3/2012 | Robinson .................... 324/433 |
| 2012/0074904 A1 | 3/2012 | Rutkowski et al. .................... 320/112 |
| 2012/0116391 A1 | 5/2012 | Houser .................... 606/41 |
| 2012/0249069 A1 | 10/2012 | Ohtomo .................... 320/109 |
| 2012/0256494 A1* | 10/2012 | Kesler et al. .................... 307/104 |
| 2012/0256568 A1 | 10/2012 | Lee .................... 318/139 |
| 2013/0115821 A1 | 5/2013 | Golko .................... 439/638 |
| 2013/0158782 A1 | 6/2013 | Bertness et al. .................... 701/34.4 |
| 2013/0311124 A1 | 11/2013 | Van Bremen .................... 702/104 |
| 2014/0002094 A1* | 1/2014 | Champlin .................... G01R 31/3624 324/426 |
| 2014/0117997 A1 | 5/2014 | Bertness .................... 324/426 |

FOREIGN PATENT DOCUMENTS

| | | |
|---|---|---|
| DE | 29 26 716 B1 | 1/1981 |
| DE | 40 07 883 | 9/1991 |
| DE | 196 38 324 | 9/1996 |
| DE | 10 2008 036 595 A1 | 2/2010 |
| EP | 0 022 450 A1 | 1/1981 |

(56) References Cited

FOREIGN PATENT DOCUMENTS

| | | |
|---|---|---|
| EP | 0 391 694 A2 | 4/1990 |
| EP | 0 476 405 A1 | 9/1991 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 807 710 B1 | 7/2007 |
| EP | 1 807 710 | 1/2010 |
| FR | 2 749 397 | 12/1997 |
| GB | 154 016 | 11/1920 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| JP | 11-271409 | 10/1999 |
| JP | 2001057711 A | 2/2001 |
| JP | 2003-346909 | 12/2003 |
| JP | 2006331976 A | 12/2006 |
| JP | 2009-244166 | 10/2009 |
| JP | 2010-172142 | 8/2010 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |
| WO | WO 2007/075403 | 7/2007 |
| WO | WO 2009/004001 | 1/2009 |
| WO | WO 2010/007681 | 1/2010 |
| WO | WO 2011/153419 | 12/2011 |
| WO | WO 2012/078921 | 6/2012 |

OTHER PUBLICATIONS

"Battery Impedance", by E. Willihnganz et al., *Electrical Engineering*, Sep. 1959, pp. 922-925.
"Determining The End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, Solid State.
"Precision of Impedance Spectroscopy Estimates of Bulk, Reation Rate, and Diffusion Parameters", by J. Macdonals et al. *J. Electronal, Chem.*, 1991, pp. 1-11.
Internal Resistance: HArbinger of Capacity Loss in Starved Electrolyte Sealed Lead Acid Batteries, by Vaccaro, F.J. et al., *AT&T Bell Laboratories*, 1987 IEEE, Ch. 2477, pp. 128-131.
IEEE Recommended Practice for Maintenance, Testings, and Replacement of Large Lead Storage Batteries for Generating Stations and Substations, *The Institute of Electrical and Electronics Engineers, Inc.*, ANSI/IEEE Std. 450-1987, Mar. 9, 1987.
"Field and Laboratory Studies to Assess the State of Health of Valve-Regulated Lead Acid Batteries: Part I Conductance/Capacity Correlation Studies", by D. Feder et al., IEEE, Aug. 1992, pp. 218-233.
"JIS Japanese Industrial Standard-Lead Acid Batteries for Automobiles", *Japanese Standards Association UDC*, 621.355.2:629.113. 006, Nov. 1995.
"Performance of Dry Cells", by C. Hambuechen, Preprint of *Am. Electrochem. Soc.*, Apr. 18-20, 1912, Paper No. 19, pp. 1-5.
"A Bridge for Measuring Storage Battery Resistance", by E. Willihncanz, *The Electrochemical Society*, preprint 79-20, Apr. 1941. pp. 253-258.
National Semiconductor Corporation, "High Q Notch Filter", Mar. 1969, Linear Brief 5, Mar. 1969.
Burr-Brown Corporation, "Design a 60 Hz Notch Filter with the UAF42", Jan. 1994, AB-071, 1994.
National Semiconductor Corporation, "LMF90-$4^{th}$-Order Elliptic Notch Filter", Dec. 1994, RRD-B30M115, Dec. 1994.
"Alligator Clips with Wire Penetrators" *J.S. Popper, Inc.* product information, downloaded from http://www.jspopper.com/, prior to Oct. 1, 2002.
"#12: LM78S40 Simple Switcher DC to DC Converter", *ITM e-Catalog*, downloaded from http://www/pbcafe.com, prior to Oct. 1, 2002.
"Simple DC-DC Converts Allows Use of Single Battery", *Electronix Express*, downloaded from http://www.elexp.com/t_dc-dc.htm, prior to Oct. 1, 2002.
"DC-DC Converter Basics", *Power Designers*, downloaded from http://www.powederdesigners.com/InforWeb.design_center/articles/DC-DC/converter.shtm, prior to Oct. 1, 2002.
"Notification of Transmittal of the International Search Report or the Declaration", PCT/US02/29461, filed Sep. 17, 2002 and dated Jan. 3, 2003.
"Notification of Transmittal of the International Search Report or the Declaration", PCT/US03/07546, filed Mar. 13, 2003 and dated Jul. 4, 2001.
"Notification of Transmittal of The International Search Report or the Declaration", PCT/US03/07837, filed Mar. 13, 2003 and dated Jul. 4, 2003.
"Notification of Transmittal of The International Search Report or the Declaration", PCT/US03/41561; Search Report completed Apr. 13, 2004, dated May 6, 2004.
"Notification of Transmittal of The International Searc Report or the Declaration", PCT/US03/27696, filed Sep. 4, 2003 and dated Apr. 15, 2004.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois pp. 1-1-14-13, (1991).

(56) References Cited

OTHER PUBLICATIONS

Supplementary European Search Report Communication for Appl. No. 99917402.2; dated Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707, filed Sep. 30, 2003 and dated Nov. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447.4, date of search Jan. 27, 2005, dated Jan. 28, 2005.
"Results of Discrete Frequency Immittance Spectroscopy (DFIS) Measurements of Lead Acid Batteries", by K.S. Champlin et al., *Proceedings of 23rd International Teleco Conference (INTELEC)*, published Oct. 2001, IEE, pp. 433-440.
"Examination Report" from the UK Patent Office for App. No. 0417678.0; dated Jan. 24, 2005.
Wikipedia Online Encyclopedia, INDUCTANCE, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
Notification of Transmittal of the International Search Report and the Written Opinion of the International *Searching* Authority, or the Declaration for PCT/US2011/038279 filed May 27, 2011, dated Sep. 16, 2011, 12 pages.
U.S. Appl. No. 60/387,912, filed Jun. 13, 2002 which is related to U.S. Pat. No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I—Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).

"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et la., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"Field Evaluation of Honda's EV PLUS Battery Packs", by A. Paryani, *IEEE AES Systems Magazine*, Nov. 2000, pp. 21-24.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in Korean patent application No. 10-2012-7033020, 2 pgs including English Translation.
Official Action dated Feb. 20, 2014 in Korean patent application No. 10-2013-7004814, 6 pgs including English Translation.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014.
Office Action for Chinese Patent Application No. 201180030045.8, dated Jul. 21, 2014.
Office Action for German Patent Application No. 1120111020643 dated Aug. 28, 2014.
Office Action from Japanese Patent Application No. 2013-513370, dated Aug. 5, 2014.
Office Action from Japanese Patent Application No. 2013-531839, dated Jul. 8, 2014.
Office Action for German Patent Application No. 103 32 625.1, dated Nov. 7, 2014, 14 pages.
Office Action from Chinese Patent Application No. 201180038844.X, dated Dec. 8, 2014.
Office Action from CN Application No. 201180011597.4, dated Jan. 6, 2015.

(56) References Cited

OTHER PUBLICATIONS

Office Action for Chinese Patent Application No. 201180030045.8, dated Mar. 24, 2015.
Office Action for Japanese Patent Application No. 2013-531839, dated Mar. 31, 2015.
Notification of Transmittal of the International Search Report and Written Opinion from PCT/US2014/069661, dated Mar. 26, 2015.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
"Improved Impedance Spectroscopy Technique for Status Determination of Production Li/SO$_2$ Batteries" Terrill Atwater et al., pp. 10-113, (1992).
"Notification of Transmittal of The International Search Report or the Declaration", PCT/US03/06577, filed Mar. 5, 2003 and dated Jul. 24, 2003.
"Notification of Transmittal of The International Search Report or the Declaration", PCT/US03/07837, filed Mar. 14, 2003 and dated Jul. 4, 2003.
Office Action for Chinese Patent Application No. 201180038844.X, dated Jun. 8, 2015.
Office Action from Chinese Patent Application No. 201180011597.4 dated Jun. 3, 2015.
European Search Report from European Application No. EP 15151426.2, dated Jun. 1, 2015.
Notification of Transmittal of the International Search Report and the Written Opinion from PCT/US2016/014867, dated Jun. 3, 2016.
Office Action from Japanese Patent Application No. 2015-014002, dated Jul. 19, 2016.
Notification of Transmittal of the International Search Report and the Written Opinion of the International Searching Authority from PCT/US2016/02696, dated Aug. 24, 2016.
Office Action from German Patent Application No. 10393251.8, dated Nov. 4, 2016, including English translation.

\* cited by examiner

Fig. 10A
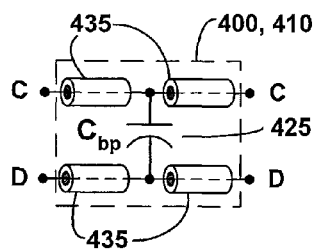
Fig. 10B
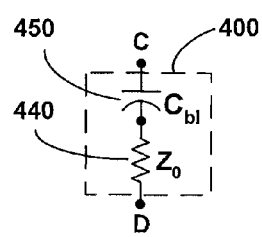
Fig. 10C
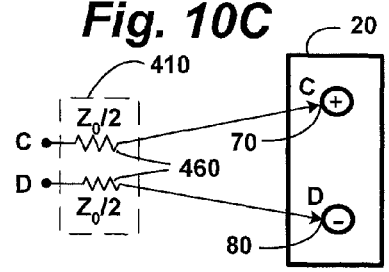
Fig. 11
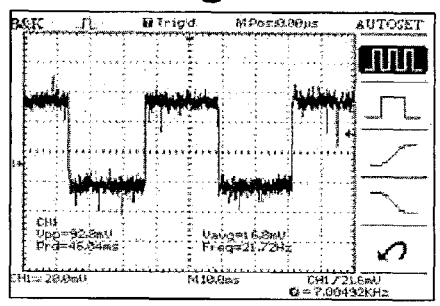
Fig. 12
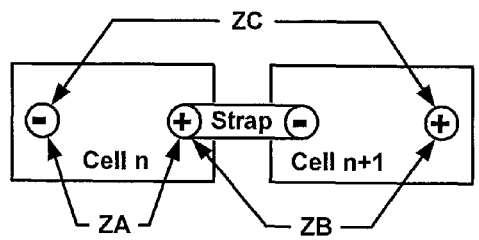
Fig. 13 *Prior Art*
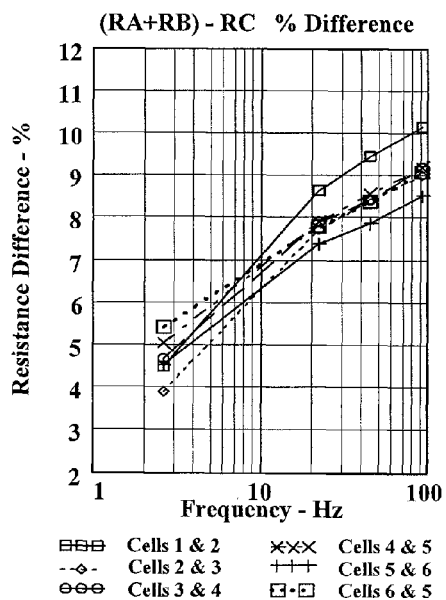
Fig. 14
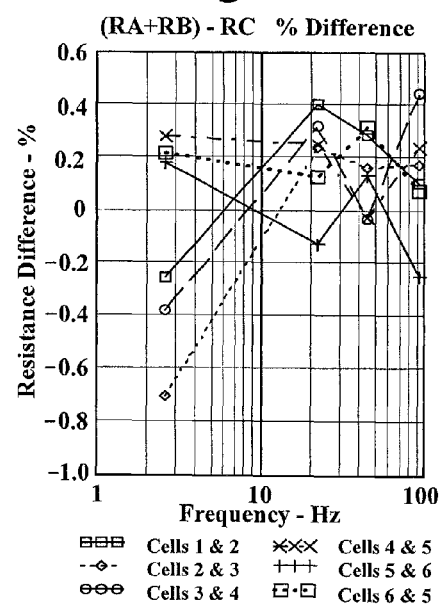

SUPPRESSING HF CABLE OSCILLATIONS DURING DYNAMIC MEASUREMENTS OF CELLS AND BATTERIES

CROSS-REFERENCE TO RELATED APPLICATION

The present application is based on and claims the benefit of U.S. provisional patent application Ser. No. 61/665,456, filed Jun. 28, 2012, the content of which is hereby incorporated by reference in its entirety.

BACKGROUND OF THE INVENTION

Electrical parameters measured with time-varying signals are referred to as dynamic parameters. The present invention relates to measuring dynamic parameters of electrochemical cells and batteries through Kelvin (4-wire) connecting cables. More specifically, it relates to suppressing high-frequency (hf) waves oscillating back and forth on a Kelvin cable's current-carrying and/or voltage-sensing conductors.

Measuring automotive and standby cell/battery parameters with time-varying signals (i.e., measuring dynamic parameters) are now commonly accepted maintenance and diagnostic procedures. (See, e.g., U.S. Pat. Nos. 5,140,269, 6,262,563, 6,534,993, and 6,623,314). Because of the very small impedances of such cells/batteries, Kelvin (4-point) connections are routinely employed to reduce the influence of the contact and lead-wire resistances. Kelvin connections couple to each cell/battery terminal at two separate contact points—one for current and one for voltage. Apparatus for measuring a two-terminal cell/battery by means of Kelvin connections therefore requires a four-wire interconnecting cable.

When using Kelvin cables with time-varying signals, distributed mutual-inductance between current-carrying and voltage-sensing conductors has been a problem. As disclosed in U.S. Pat. Nos. 7,106,070 and 7,425,833, mutual-inductance can be reduced by inserting a special cable section in tandem with the original Kelvin cable. This special section transposes conductors thereby introducing a negative mutual-inductance section to cancel the positive mutual-inductance of the original Kelvin cable.

However, even after canceling a cable's mutual-inductance, a significant problem remains. The current-carrying conductors and the voltage-sensing conductors comprise two twisted-pair distributed-parameter transmission lines—not unlike those found in Category-5 Ethernet cables. These lines may extend over several meters in length. As with all distributed-parameter transmission lines, internal wave reflections can occur unless the lines are terminated in their characteristic impedances—a situation which virtually never occurs in practice. Such hf waves, oscillating back and forth, can interact with measuring circuitry to seriously degrade the accuracy of low-frequency dynamic measurements performed with circuitry connected through the Kelvin cables. Ironically, the very technique for reducing mutual-inductance described above introduces discontinuities that can actually contribute to such oscillations. Solving this previously-unrecognized wave-oscillation problem is the purpose of the present invention.

Consider FIG. 1. FIG. 1 depicts prior-art measuring circuitry 10 connected to cell/battery 20 by means of four-wire cable 30, Y-junction 40, and Kelvin conductors A, B, C, and D. Current-carrying conductors A and B couple to positive and negative cell/battery terminals at contact points 50 and 60, respectively. Voltage-sensing conductors C and D separately couple to positive and negative cell/battery terminals at contact points 70 and 80, respectively. During dynamic measurements, a time-varying current flows through current-carrying conductors A and B and also flows inside cell/battery 20 along an internal current path 90.

FIG. 2 shows a typical arrangement of conductors employed in prior-art apparatus such as that shown in FIG. 1. Measuring circuitry 10 comprises current-excitation circuitry 160, voltage-sensing circuitry 170, computation/control circuitry 180, and display circuitry 190. Current-excitation circuitry 160 and voltage-sensing circuitry 170 couple, respectively, to the A-B conductor-pair 140 of four-wire cable 30 at terminals 200 and 210, and to the C-D conductor-pair 150 of four-wire cable 30 at terminals 220 and 230. Computation/control circuitry 180 communicates bilaterally with both current-excitation circuitry 160 and voltage-sensing circuitry 170 and receives current- and voltage-signal inputs with which it computes dynamic parameters of cell/battery 20. The results of this computation are communicated to the user through display 190.

FIG. 2 further discloses a spaced-apart cable section 35 comprising an A-C pair of insulated wires 120 contacting the positive terminal of cell/battery 20 at points 50 and 70, respectively, and a B-D pair of insulated wires 130 contacting the negative cell/battery terminal at points 60 and 80, respectively. Each of these conductor-pairs comprises a current-carrying conductor paired with a voltage-sensing conductor. Pairs 120 and 130 are necessarily spaced-apart at the cell/battery terminals but are brought into close proximity at Y-junction 40 where they are re-arranged for connection to four-wire cable section 30. Throughout section 30, the A-B current-carrying conductors and the C-D voltage-sensing conductors are separately paired and twisted together, pair 140 and pair 150, respectively, to reduce mutual inductance between current-carrying and voltage-sensing circuits. The A-B and C-D conductors therefore comprise two twisted-pair distributed-parameter transmission lines of approximate length l.

FIG. 3 shows current-excitation circuitry 160 of a type commonly employed in prior-art dynamic battery testing apparatus. Feedback excitation circuitry of this kind was first described by Wurst, et al., in U.S. Pat. No. 5,047,722. However, this early disclosure did not include Kelvin connections to the cell/battery, nor did it take into consideration the effect of the distance between the measuring circuitry and the cell/battery being tested.

The A-B current-carrying conductors 360 of the battery-connecting cable are shown in FIG. 3. These conductors include twisted-pair 140 of section 30 as well as the A and B conductors of spaced-apart section 35 of FIG. 2. They may also include a mutual-inductance-canceling section, and their total length can extend several meters.

The current-excitation circuitry 160 disclosed in FIG. 3 comprises the series combination of resistor 300, n-channel MOSFET 310, and the A and B battery-cable terminals, 200 and 210, respectively. This circuitry also includes operational amplifier 320 having its output terminal coupled to the gate of MOSFET 310 through resistor 350. The common connection of resistor 300 and MOSFET 310 couples to the inverting (−) input of operational amplifier 320 through resistor 330, thus providing negative feedback to amplifier 320. As a result, the instantaneous voltage at the amplifier's inverting (−) input, $R_{300} \times i(t)$, tracks the voltage v(t) applied to its non-inverting (+) input. Accordingly, computation/control circuitry 180 controls the current waveform i(t) flowing through cell/battery 10 by applying an appropriate voltage signal v(t) to the noninverting (+) input of amplifier 320. Resistors 330, 350, and capacitor 340 are compensation components—introduced specifically to ensure circuit stability at high frequency.

Note that current i(t) can only pass through n-channel MOSFET 310 from drain to source. Accordingly, MOSFET 310 cuts off, and no current flows through cell/battery 20, when v(t)<0. Cell/battery current can only flow when v(t)>0; and it can then only flow in the discharging direction.

Similar feedback current-excitation circuitry, disclosed in U.S. Pat. Nos. 6,466,026 and 6,621,272, includes a p-channel MOSFET and a dc power supply. With that circuitry, v(t)<0 causes the p-channel MOSFET to conduct—resulting in current flowing from the dc power supply into cell/battery 10 in the charging direction. Thus, cell/battery current can flow in either direction with the advanced circuitry disclosed in U.S. Pat. Nos. 6,466,026 and 6,621,272. In other respects, that circuitry functions just like the circuitry of FIG. 3.

FIG. 4 shows a voltage waveform sometimes observed across series-resistor 300 in prior-art current-excitation circuitry 160 when it is exciting cell/battery 20 with a 22 Hz square wave. One notes large hf oscillations in the A-B current during conduction of MOSFET 310. Close observations have shown that the frequency of these oscillations is greater than 10 MHz. Furthermore, the usual techniques for suppressing hf oscillations in feedback circuits, such as introducing compensation components 330, 340, and 350, or placing picofarad-size bypass capacitors at various points within the circuit, have proven to be surprisingly ineffective. Suppressing such oscillations is an object of the present invention.

SUMMARY OF THE INVENTION

I have discovered that hf reflected waves on Kelvin cables can oscillate back and forth, thus causing seriously degraded low-frequency measurement accuracy. At high-frequency, the current-carrying conductors and the voltage-sensing conductors of Kelvin cables comprise two distributed-parameter twisted-pair transmission lines—not unlike those found in Category-5 Ethernet cables—which may extend several meters in length. As with all distributed-parameter transmission lines, internal wave reflections can occur unless the lines are terminated in their characteristic impedances—a situation which virtually never occurs in practice. Such oscillating reflected waves can interact with measuring circuitry to seriously degrade the accuracy of low-frequency dynamic measurements performed with circuitry connected through Kelvin cables.

Apparatus for suppressing hf oscillations on Kelvin cables is disclosed herein. It comprises magnetic material surrounding the cable, and/or circuitry inserted at the input end and/or the output end of the cable's current-carrying and/or voltage-sensing conductors.

BRIEF DESCRIPTION OF THE DRAWINGS

FIG. 10A is a schematic diagram showing one embodiment of suppression circuitry 400 and/or 410 applied to either end of the voltage-sensing C-D transmission line.

FIG. 10B is a schematic diagram showing another embodiment of suppression circuitry 400 applied to the input end of the voltage-sensing C-D transmission line.

FIG. 10C is a schematic diagram showing another embodiment of suppression circuitry 410 applied to the output end of the voltage-sensing C-D transmission line.

FIG. 11 is an oscilloscope image showing the voltage waveform across resistor 300 after inserting suppression circuitry 400—comprising a 10 µF bypass capacitor 420—at the input of the A-B transmission line.

FIG. 12 is a drawing of two cells connected in series showing the definitions of impedances ZA, ZB, and ZC measured in a 3-point impedance experiment.

FIG. 13 is a frequency plot of the percent differences between (RA+RB) and RC for six series-connected cell-pairs measured in a 3-point impedance experiment before introducing any suppression circuitry.

FIG. 14 is a frequency plot of the percent differences between (RA+RB) and RC for six series-connected cell-pairs measured in a 3-point impedance experiment after inserting suppression circuitry 400 comprising a 10 µF bypass capacitor 420 at the input end of the A-B transmission line.

DETAILED DESCRIPTION OF THE INVENTION

Figure 2:
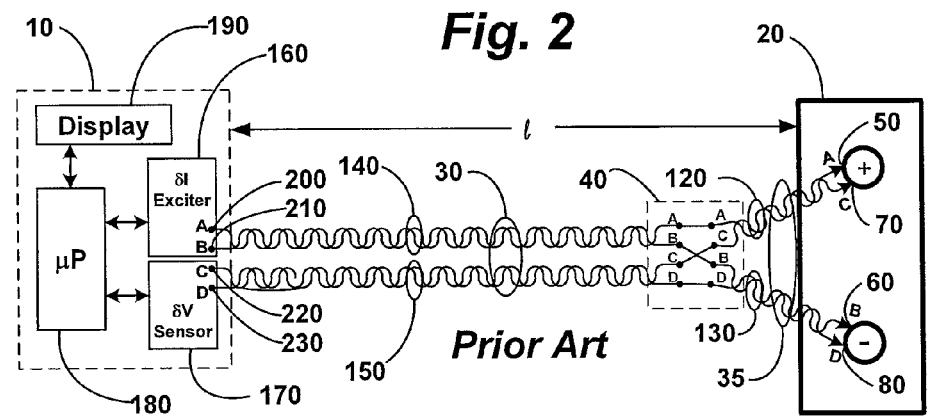
FIG. 2 is a schematic representation of a prior-art conductor arrangement commonly employed with the apparatus of FIG. 1.
Figure 3:
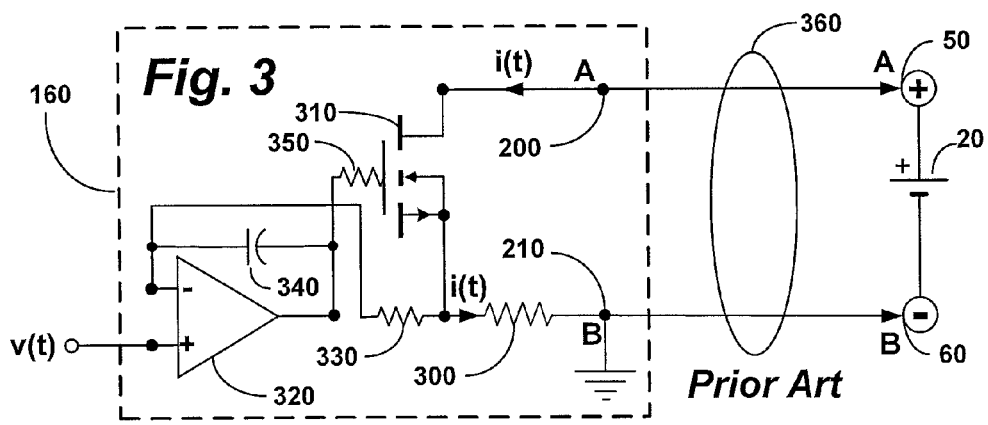
FIG. 3 is a schematic diagram depicting prior-art current-excitation circuitry commonly employed in the dynamic battery testing apparatus of FIG. 1.

Consider twisted pairs 140 and 150 of the 4-wire Kelvin cable section 30 depicted in FIG. 2. Except for the wire size, these twisted pairs are very much like the twisted-pair transmission lines found in Category-5 Ethernet cables. (See, e.g., http://en.wikipedia.org/wiki/Category_5_cable). Accordingly, we will assume that these lines have characteristic impedances of $Z_0=100\Omega$ and that their propagation velocities are $v_p=0.64 \cdot c$, where $c=3 \cdot 10^8$ m/s is the velocity of light in free space. We will also assume that the A-B transmission line has length l=2 m and comprises twisted wires of size AWG #12 (Cat-5 cables use AWG #24). This assumption yields an approximate ac wire resistance of $R_{ac}=0.199$ Ω/m near the quarter-wavelength frequency $f_{\lambda/4}=v_p/4l=24.0$ MHz. (See, e.g., http://www.cvel.clemson.edu/emc/calculators/Resistance_Calculator/wire.html).

The impedance of cell/battery 20 is typically only a few milliohms—a value much less than the A-B line's characteristic impedance $Z_0 \cong 100\Omega$. Accordingly, the cell/battery will be modeled herein as a short-circuit terminating the A-B transmission line.

Figure 5:
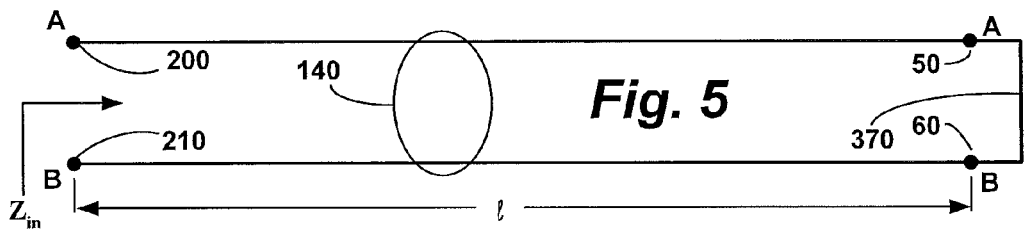
FIG. 5 is a depiction of the A-B current-carrying conductors of FIG. 2 modeled as a short-circuited transmission line.

Consider FIG. 5. This figure depicts an A-B transmission line 140 of length l=2 m terminated in short-circuit 370. According to well-known transmission line theory, the input impedance $Z_{in}$ of such a transmission line can be written $$Z_{in} = Z_0 \tan h(\gamma l) \qquad (1)$$

where $$\gamma = \alpha + j\beta \qquad (2)$$

with $$\alpha = 2R_{ac}/Z_0 \qquad (3)$$

and $$\beta = 2\pi f/v_p. \qquad (4)$$

Figure 6:
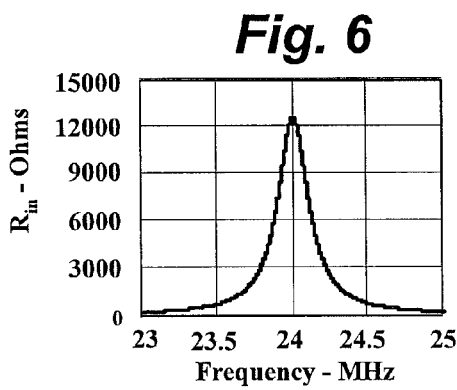
FIG. 6 is a frequency plot of the real part of the input impedance of the transmission line of FIG. 5 near its quarter-wavelength resonance frequency.
Figure 7:
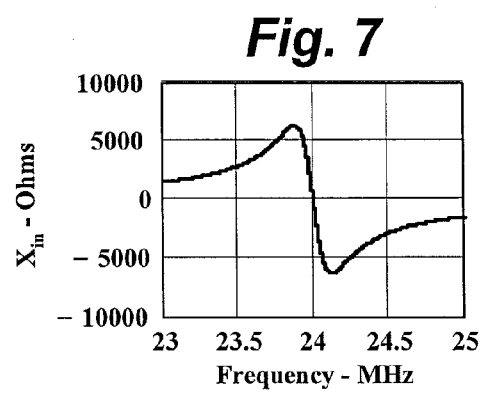
FIG. 7 is a frequency plot of the imaginary part of the input impedance of the transmission line of FIG. 5 near its quarter-wavelength resonance frequency.

FIGS. 6 and 7 show calculated frequency plots of the real and imaginary parts of $Z_{in}$ in the vicinity of the quarter-wavelength frequency $f_{\lambda/4}$=24.0 MHz. One notes a very sharp resonance at 24.0 MHz—with the input resistance of the short-circuited A-B line rising above 12,000Ω at the resonance frequency. The calculated Q of this resonance is $$Q_{\lambda/4} = \pi f_{\lambda/4}/\alpha v_p = 99 \qquad (5)$$

which classifies this as a "high-Q" resonance.

Accordingly, the A-B line's input impedance at frequency $f_{\lambda/4}$ is very large compared with the excitation circuit's hf output impedance ($R_{300} \cong 0.02\Omega$; $R_{DS}(\text{on}) \cong 0.005\Omega$). This ensures that any switching transients of MOSFET 310 that possess frequency components near $f_{\lambda/4}$ will excite large hf voltage wavefronts on the A-B transmission line. Furthermore, the line's high Q, along with its unmatched terminations, ensures that such wavefronts, once excited, will undergo multiple reflections. These large oscillating wavefronts, if they arrive back at circuitry 160 in the proper phase, can cause MOSFET 310 to switch states—thus reinforcing this spurious excitation process.

Figure 8:
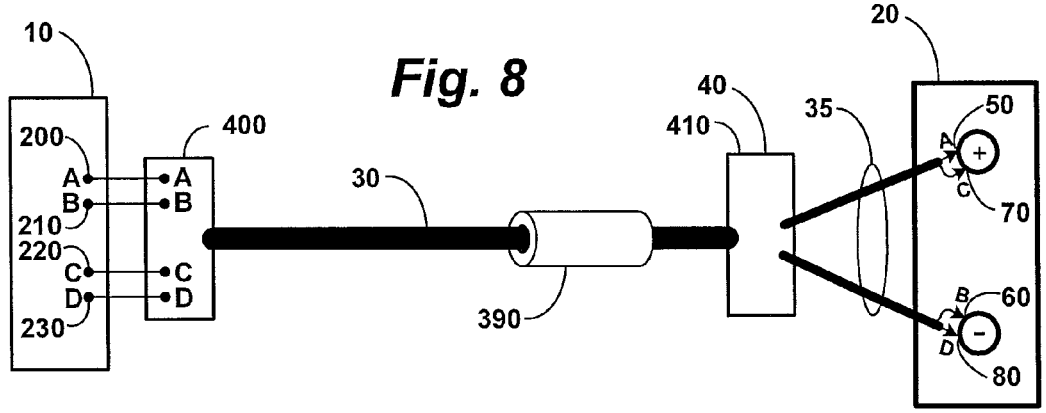
FIG. 8 is a drawing of measuring apparatus which includes oscillation suppression devices 390, 400 and 410.

FIG. 8 discloses general means for suppressing such oscillations according to several embodiments of the present invention. One embodiment comprises magnetic core material 390 surrounding a section of four-wire cable 30 to introduce hf loss and attenuation into both two-wire transmission lines contained therein. Alternatively, suppression circuitry 400 or suppression circuitry 410 can be introduced at the cable's input interface between measuring circuitry 10 and four-wire cable 30, or its output interface between four-wire cable 30 and spaced-apart cable section 35. Suppression circuitry 410 may actually be an integral part of cable section 35 or of Y-junction 40.

Figure 9A:
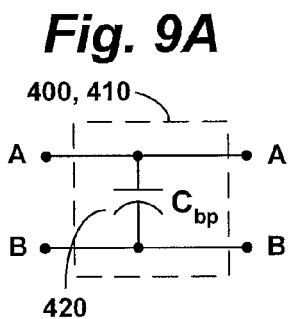
FIG. 9A is a schematic diagram showing one embodiment of suppression circuitry 400 and/or 410 applied to either end of the current-carrying A-B transmission line.
Figure 9B:
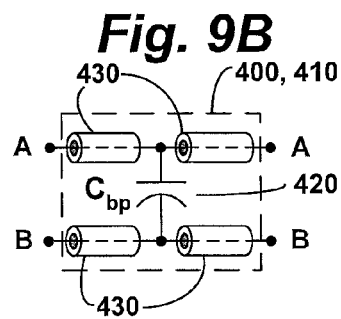
FIG. 9B is a schematic diagram showing another embodiment of suppression circuitry 400 and/or 410 applied to either end of the current-carrying A-B transmission line.
Figure 9C:
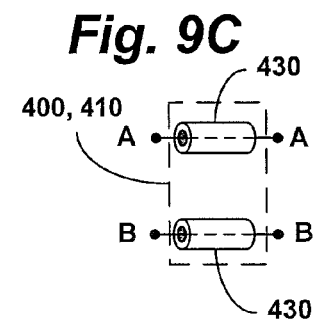
FIG. 9C is a schematic diagram showing still another embodiment of suppression circuitry 400 and/or 410 applied to either end of the current-carrying A-B transmission line.

FIGS. 9A, 9B, and 9C disclose examples of suppression circuitry inserted at the input end 400 and/or the output end 410 of the A-B transmission line. This circuitry comprises bypass capacitor 420 connected across the A-B terminals to provide a hf signal-path between conductors, and/or magnetic cores 430 surrounding the A-B conductors to impede hf current flow. As shown in these three figures, the bypass capacitor and the magnetic cores can be either utilized separately, or in combination with one another. Such circuitry at the A-B line's input 400 functions by preventing excitation circuitry 160 from exciting spurious wavefronts on the A-B transmission line. Such circuitry at the line's output 410 prevents spurious wavefronts, once excited, from being reflected back.

The C-D transmission line presents a different problem and must be treated differently. Unlike current excitation circuitry 160, voltage sensing circuitry 170 cannot excite hf wavefronts on the line. Such wavefronts can, however, be excited by transient switching currents passing through cell/battery 20 during measurement. This mechanism can be particularly troublesome when measuring UPS and telecom cells/batteries while they are in service.

FIG. 10A discloses suppression circuitry similar to that disclosed in FIG. 9B applied to the C-D transmission line. This circuitry comprises bypass capacitor 425 along with magnetic cores 435. Again, the bypass capacitor and the magnetic cores can be either utilized separately, or in combination with one another, and can be connected at the line's input end 400, and/or its output end 410. However, there is a significant difference between such suppression circuitry applied to the C-D transmission line and that applied to the A-B transmission line. The very large input impedance of voltage-sensing circuitry 170 compared with the very small output impedance of current-excitation circuitry 160 dictates that the value of bypass capacitor 425 connected across C-D conductors will be much smaller than that of bypass capacitor 420 connected across the A-B conductors.

FIG. 10B discloses another form of suppression circuitry that can be applied to the circuitry end 400 of the C-D transmission line. A resistance 440 of approximate value to the line's characteristic impedance—in series with blocking capacitor 450—can be connected directly across the line. Blocking capacitor 450 is necessary to prevent the battery's dc current from flowing through resistance 440. Because the hf input impedance of voltage-sensing circuitry 170 is much larger than resistance $Z_0$ in parallel, the C-D line will be essentially terminated in its characteristic impedance $Z_0$—thus preventing hf reflections from occurring at the circuitry-end of the C-D transmission line.

FIG. 10C discloses a similar suppression technique that can be applied to the cell/battery-end 410 of the C-D transmission line. Resistances 460, whose sum value approximates the line's characteristic impedance, are connected in series with the C and/or D conductors at the cell/battery-end. Resistances 460 may actually be an integral part of cable section 35 or of Y-junction 40. Essentially no dc voltage drop occurs across these resistances because of the very small dc current flowing in the voltage-sensing circuit. Furthermore, because of the very small series impedance of cell/battery 20 (<10 mΩ), the C-D line will be essentially terminated in its characteristic impedance $Z_0$—thus preventing reflections from occurring at the cell/battery-end of the line.

Figure 1:
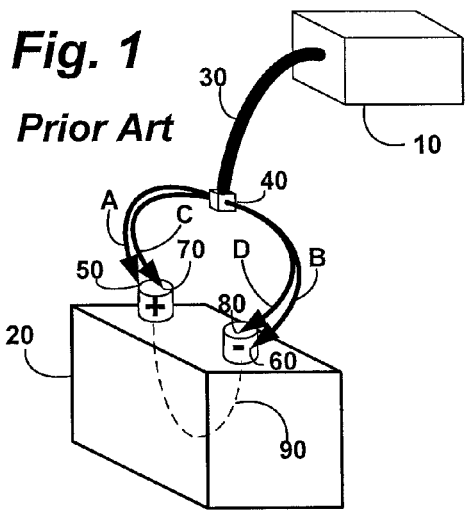
FIG. 1 is a drawing illustrating prior-art dynamic measuring circuitry connected to a cell/battery by means of Kelvin connections.
Figure 4:
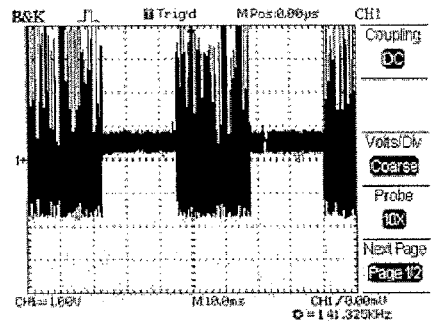
FIG. 4 is an oscilloscope image showing the voltage waveform sometimes seen across series resistor 300 in a prior-art circuit such as that depicted in FIG. 3.

FIG. 11 is an oscilloscope image showing the voltage waveform across series resistor 300 after inserting suppression circuitry 400, comprising bypass capacitor 420 depicted in FIG. 9A, at the input of the A-B transmission line. The value of capacitor 420 is 10 μF. Such a surprisingly large value is necessary to completely suppress oscillations because of the very small hf output impedance of current-excitation circuitry 160 ($R_{300} \cong 0.02\Omega$; $R_{DS}(\text{on}) \cong 0.005\Omega$). Note that the spurious high-frequency oscillations observed in prior-art FIG. 4 have completely disappeared in FIG. 11.

FIG. 12 is a drawing depicting a "3-point impedance measurement" experiment devised to investigate the effect of suppression circuitry upon measurement accuracy. Two cells, connected in series with a conventional strap, are open-circuited. The three impedances defined in FIG. 12—ZA, ZB, and ZC—are then measured. If these three measurements are accurately performed, one should find that ZA+ZB=ZC—to within a high degree of accuracy. Any deviation from this simple result would indicate measurement error.

This 3-point experiment was performed before, and after, connecting the 10 µF bypass capacitor 420 across the A and B terminals at the A-B transmission line input 400. The subject battery was a 25 Ah 6-cell Hawker Cyclon battery—chosen because of its exposed cell-terminals and interconnecting straps. The six cells of the open-circuited battery were measured as six pairs, each pair comprising two adjacent cells. Three complex impedance measurements were performed on each adjacent cell-pair at frequencies of 2.58, 22.22, 44.44, and 90.91 Hz. FIGS. 13 and 14 show the results of these measurements.

FIGS. 13 and 14 are frequency plots of the percent differences between (RA+RB) and RC for the six adjacent cell-pairs. (R is the real part of measured impedance Z.) FIG. 13 displays prior-art results obtained from data measured before connecting the 10 µF bypass capacitor 420 across the A and B terminals at 400. FIG. 14 displays new results obtained after connecting the 10 µF bypass capacitor 420 across the A and B terminals at 400.

One sees from FIGS. 13 and 14 that the 10 µF bypass capacitor dramatically improves measurement accuracy. Before inserting capacitor 420, the observed percent differences varied from nearly 4% to more than 10%. A trend for the errors to increase with frequency is very apparent. After inserting capacitor 420, all percent differences are less than 0.8%, and most are less than 0.4%. In addition, the frequency dependence of the errors has disappeared.

This completes the disclosure of my invention. The invention comprises a magnetic material surrounding the cable, and/or circuitry inserted at the input end and/or the output end of the cable's current-carrying and/or voltage-sensing conductors. A particular embodiment of the invention simply comprises a large bypass capacitor connected directly across the current-carrying conductors at the interface between the measuring circuitry's output and the Kelvin cable's input. Other embodiments include magnetic cores placed on the current-carrying and/or the voltage-sensing conductors and/or characteristic-impedance resistances terminating the voltage-sensing conductors. These embodiments represent simple, yet effective solutions to an important, but previously unrecognized problem.

Although suppression circuitry has been disclosed inserted at the line's input, its output, or both, it could also be inserted internally to the line, at say, the terminus of a mutual-inductance cancellation section. These, and other variations, will be apparent to those skilled in the art and are intended to be covered by the appended claims.

What is claimed is:

1. Apparatus employing time-varying signals to test an electrochemical cell or battery comprising: measuring circuitry containing current-excitation circuitry and voltage-sensing circuitry, said current-excitation circuitry adapted to couple to said cell or battery with an A-B conductor pair and said voltage-sensing circuitry adapted to couple to said cell or battery with a separate C-D conductor pair, a four-wire cable section connected to said measuring circuitry, said four-wire cable section comprising said A-B conductor pair and said C-D conductor pair bound together in close proximity to one-another within the same four-wire cable section, wherein A-B conductor pair and the C-D conductor pair of the four-wire cable section acts as a transmission line at high frequency and introduces an impedance mismatch between the four-wire cable section and the measurement circuitry, a spaced-apart cable section interconnecting said four-wire cable section with positive and negative terminals of said electrochemical cell or battery, wherein the A-B conductor pair and the C-D conductor pair in the spaced apart cable section acts as a transmission line at high frequency and introduces an impedance mismatch between the spaced apart cable section and said electrochemical cell or battery; and, a bypass capacitor connected directly across said A-B conductor pair, said bypass capacitor suppressing high-frequency reflected waves oscillating on a two-wire transmission line comprising said A-B conductor pair due to said impedance mismatches.

2. The apparatus of claim 1 wherein said bypass capacitor is connected at an interface between said measuring circuitry and said four-wire cable section.

3. The apparatus of claim 1 wherein said bypass capacitor is connected at an interface between said four-wire cable section and said spaced-apart cable section.

4. The apparatus of claim 2 wherein said bypass capacitor is at least 1 microfarad in value.

5. Apparatus employing time-varying signals to test an electrochemical cell or battery comprising: measuring circuitry containing current-excitation circuitry and voltage-sensing circuitry, said current-excitation circuitry adapted to couple to said cell or battery with an A-B conductor pair and said voltage-sensing circuitry adapted to couple to said cell or battery with a separate C-D conductor pair, a four-wire cable section connected to said measuring circuitry, said four-wire cable section comprising said A-B conductor pair and said C-D conductor pair bound together in close proximity to one-another within the same four-wire cable section, wherein A-B conductor pair and the C-D conductor pair of the four-wire cable section acts as a transmission line at high frequency and introduces an impedance mismatch between the four-wire cable section and the measurement circuitry, a spaced-apart cable section interconnecting said four-wire cable section with positive and negative terminals of said electrochemical cell or battery, wherein the A-B conductor pair and the C-D conductor pair in the spaced apart cable section acts as a transmission line at high frequency and introduces an impedance mismatch between the spaced apart cable section and said electrochemical cell or battery; and, one or more magnetic cores placed upon said A-B conductor pair, said magnetic cores suppressing high-frequency reflected waves oscillating on a two-wire transmission line comprising said A-B conductor pair due to said impedance mismatches.

6. The apparatus of claim 5 wherein said magnetic cores are placed at an interface between said measuring circuitry and said four-wire cable section.

7. The apparatus of claim 5 wherein said magnetic cores are placed at an interface between said four-wire cable section and said spaced-apart cable section.

8. Apparatus employing time-varying signals to test an electrochemical cell or battery comprising: measuring circuitry containing current-excitation circuitry and voltage-sensing circuitry, said current-excitation circuitry adapted to couple to said cell or battery with an A-B conductor pair and said voltage-sensing circuitry adapted to couple to said cell or battery with a separate C-D conductor pair, a four-wire cable section connected to said measuring circuitry, said four-wire cable section comprising said A-B conductor pair and said C-D conductor pair bound together in close proximity to one-another within the same four-wire cable section, wherein A-B conductor pair and the C-D conductor pair of the four-wire cable section acts as a transmission line at high frequency and introduces an impedance mismatch between the four-wire cable section and the measurement circuitry, a spaced-apart cable section interconnecting said four-wire cable section with positive and negative terminals of said electrochemical cell or battery, wherein the A-B conductor pair and the C-D conductor pair in the spaced apart cable section acts as a transmission line at high frequency and introduces an impedance mismatch between the spaced apart cable section and said electrochemical cell or battery; and, a bypass capacitor connected directly across said C-D conductor pair said bypass capacitor suppressing high-frequency reflected waves oscillating on a two-wire transmission line comprising said C-D conductor pair due to said impedance mismatches.

9. The apparatus of claim 8 wherein said bypass capacitor is connected at an interface between said measuring circuitry and said four-wire cable section.

10. The apparatus of claim 8 wherein said bypass capacitor is connected at an interface between said four-wire cable section and said spaced-apart cable section.

11. Apparatus employing time-varying signals to test an electrochemical cell or battery comprising: measuring circuitry containing current-excitation circuitry and voltage-sensing circuitry, said current-excitation circuitry adapted to couple to said cell or battery with an A-B conductor pair and said voltage-sensing circuitry adapted to couple to said cell or battery with a separate C-D conductor pair, a four-wire cable section connected to said measuring circuitry, said four-wire cable section comprising said A-B conductor pair and said C-D conductor pair bound together in close proximity to one-another within the same four-wire cable section, wherein A-B conductor pair and the C-D conductor pair of the four-wire cable section acts as a transmission line at high frequency and introduces an impedance mismatch between the four-wire cable section and the measurement circuitry, a spaced-apart cable section interconnecting said four-wire cable section with positive and negative terminals of said electrochemical cell or battery, wherein the A-B conductor pair and the C-D conductor pair in the spaced apart cable section acts as a transmission line at high frequency and introduces an impedance mismatch between the spaced apart cable section and said electrochemical cell or battery; and, one or more magnetic cores placed upon said C-D conductor pair, said magnetic cores suppressing high-frequency reflected waves oscillating on a two-wire transmission line comprising said C-D conductor pair due to said impedance mismatches.

12. The apparatus of claim 11 wherein said magnetic cores are placed at an interface between said measuring circuitry and said four-wire cable section.

13. The apparatus of claim 11 wherein said magnetic cores are placed at an interface between said four-wire cable section and said spaced-apart cable section.

14. Apparatus employing time-varying signals to test an electrochemical cell or battery comprising:
measuring circuitry adapted to couple to said cell or battery with separate current-carrying and voltage-sensing conductors, a Kelvin cable interposed between said measuring circuitry and said cell or battery, said Kelvin cable comprising a pair of current-carrying conductors and a pair of voltage-sensing conductors, said pair of voltage-sensing conductors
possessing a particular characteristic impedance value; and, a blocking capacitor and a resistor connected in series across said pair of voltage-sensing conductors at an interface between said measuring circuitry and said Kelvin cable, said resistor having a value essentially equal to said particular characteristic impedance value.

15. Apparatus employing time-varying signals to test an electrochemical cell or battery comprising:
measuring circuitry adapted to couple to said cell or battery with separate current-carrying and voltage-sensing conductors, a four-wire cable section interfaced with said measuring circuitry, said four-wire cable section comprising a pair of current-carrying conductors and a pair of voltage-sensing conductors, said pair of voltage-sensing conductors possessing a particular characteristic impedance value, a spaced-apart cable section interposed between said four-wire cable section and said cell or battery, said spaced-apart cable section possessing a pair of voltage-sensing conductors that separately contact positive and negative terminals of said cell or battery; and, one or more resistances connected in series with said voltage sensing conductors in said spaced-apart cable section, said resistances being essentially equal in sum value to said particular characteristic impedance value.

* * * * *

UNITED STATES PATENT AND TRADEMARK OFFICE
CERTIFICATE OF CORRECTION

PATENT NO. : 9,851,411 B2
APPLICATION NO. : 13/795840
DATED : December 26, 2017
INVENTOR(S) : Keith S. Champlin Page 1 of 1

It is certified that error appears in the above-identified patent and that said Letters Patent is hereby corrected as shown below:

On the Title Page

In the references item (56) OTHER PUBLICATIONS:

Please delete:
""A Package for Impedance/Admittance Data Analysis", by B. Boukamp, Solid State"
And insert:
--"A Package for Impedance/Admittance Data Analysis", by B. Boukamp, Solid State Ionics, 1986, pgs. 136-140--

Please delete:
""Notification of Transmittal of The International Searc Report or the Declaration", PCT/US03/27696, filed Sep. 4, 2003 and dated Apr. 15, 2004"
And insert:
--"Notification of Transmittal of The International Search Report or the Declaration", PCT/US03/27696, filed Sep. 4, 2003 and dated Apr. 15, 2004--

Please delete:
""DSP Applications in Hybrid Electric Vehicle Powertrain", Miller et al., Proceedings of the American Control Conference, Sand Diego, CA, Jun. 1999; 2 ppg."
And insert:
--"DSP Applications in Hybrid Electric Vehicle Powertrain", Miller et al., Proceedings of the American Control Conference, San Diego, CA, Jun. 1999; 2 ppg.--

Please delete:
""Condutance Monitoring of Recombination Lead Acid Batteries", by B. Jones, May 1993, pp. 1-6; (11 total pgs.)"
And insert:
--"Conductance Monitoring of Recombination Lead Acid Batteries", by B. Jones, May 1993, pp. 1-6; (11 total pgs.)--

Signed and Sealed this
Ninth Day of April, 2019

Andrei Iancu
*Director of the United States Patent and Trademark Office*